US 6,818,289 B2

(12) United States Patent
MacDougall et al.

(10) Patent No.: US 6,818,289 B2
(45) Date of Patent: Nov. 16, 2004

(54) MESOPOROUS FILMS HAVING REDUCED DIELECTRIC CONSTANTS

(75) Inventors: James Edward MacDougall, New Tripoli, PA (US); Kevin Ray Heier, Macungie, PA (US); Scott Jeffrey Weigel, Allentown, PA (US); Timothy W. Weidman, Sunnyvale, CA (US); Alexandros T. Demos, Fremont, CA (US); Nikolaos Bekiaris, San Jose, CA (US); Yunfeng Lu, San Jose, CA (US); Michael P Nault, San Jose, CA (US); Robert Parkash Mandal, Saratoga, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 53 days.

(21) Appl. No.: 10/263,254

(22) Filed: Oct. 2, 2002

(65) Prior Publication Data

US 2003/0157311 A1 Aug. 21, 2003

Related U.S. Application Data

(60) Division of application No. 09/711,573, filed on Nov. 13, 2000, now Pat. No. 6,592,980, which is a continuation-in-part of application No. 09/518,955, filed on Mar. 3, 2000, now Pat. No. 6,365,266, which is a continuation-in-part of application No. 09/455,999, filed on Dec. 7, 1999, now abandoned.

(51) Int. Cl.[7] .............................. B32B 3/26; B05D 1/36; C23C 16/06

(52) U.S. Cl. ................. 428/304.4; 428/312.2; 427/255.11; 427/372.2; 427/376.2; 427/419.2; 106/14.13; 106/14.41

(58) Field of Search .......................... 428/304.4, 312.2, 428/312.6, 314.8, 701, 702; 106/14.13, 14.41; 427/226, 162, 299, 372.2, 430.1, 376.2, 385.5, 443.2, 255.11, 419.2

(56) References Cited

U.S. PATENT DOCUMENTS

| | | | |
|---|---|---|---|
| 2,692,838 A | 10/1954 | Thurber | |
| 4,010,133 A | 3/1977 | Nakayama | ................. 260/29.6 |
| 4,271,210 A | 6/1981 | Yoldas | |
| 5,021,398 A | 6/1991 | Sharma et al. | ................. 505/1 |
| 5,605,628 A | 2/1997 | Davidson et al. | ...... 210/321.83 |

(List continued on next page.)

FOREIGN PATENT DOCUMENTS

| | | | |
|---|---|---|---|
| EP | 0 775 669 A2 | 5/1997 | |
| EP | 1123753 A2 * | 8/2001 | |
| JP | 02001226171 A * | 8/2001 | |
| WO | 9937705 | 7/1999 | .............. C08J/9/00 |
| WO | 0037374 | 6/2000 | ........... C03C/17/00 |
| WO | 0039028 | 7/2000 | ........... C01B/37/02 |

OTHER PUBLICATIONS

"Introduction to Ceramics" p. 948, John Wiley & Sons, Inc., 1970.

(List continued on next page.)

Primary Examiner—Kiley Stoner
(74) Attorney, Agent, or Firm—Geoffrey L. Chase

(57) ABSTRACT

A process provides a ceramic film, such as a mesoporous silica film, on a substrate, such as a silicon wafer. The process includes preparing a film-forming fluid containing a ceramic precursor, a catalyst, a surfactant and a solvent, depositing the film-forming fluid on the substrate, and removing the solvent from the film-forming fluid on the substrate to produce the ceramic film on the substrate. The ceramic film has a dielectric constant below 2.3, a halide content of less than 1 ppm and a metal content of less than 500 ppm, making it useful for current and future microelectronics applications.

11 Claims, 4 Drawing Sheets

U.S. PATENT DOCUMENTS

| | | | |
|---|---|---|---|
| 5,645,891 A | 7/1997 | Liu et al. | 427/376.2 |
| 5,858,457 A | 1/1999 | Brinker et al. | 427/162 |
| 5,858,526 A | 1/1999 | Floch et al. | 428/327 |
| 5,889,449 A | 3/1999 | Fledziuszko | 333/239 |
| 5,922,299 A | 7/1999 | Bruinsma et al. | 423/335 |
| 5,955,140 A | 9/1999 | Smith et al. | 427/96 |
| 5,969,088 A | 10/1999 | Ezzell et al. | 528/353 |
| 6,011,167 A | 1/2000 | Tashiro et al. | 556/410 |
| 6,027,666 A | 2/2000 | Ozin et al. | 252/301.4 R |
| 6,120,891 A | 9/2000 | Balkus, Jr. et al. | 428/336 |
| 6,197,913 B1 * | 3/2001 | Zhong | 528/31 |
| 6,208,014 B1 | 3/2001 | Wu et al. | 257/629 |
| 6,211,096 B1 | 4/2001 | Allman et al. | 438/787 |
| 6,365,266 B1 | 4/2002 | MacDougall et al. | 428/304.4 |
| 6,423,148 B1 * | 7/2002 | Aoki | 134/3 |
| 6,447,846 B2 * | 9/2002 | Nakamura et al. | 427/387 |
| 6,576,568 B2 * | 6/2003 | Mandal et al. | 438/781 |
| 6,579,153 B2 * | 6/2003 | Uchikura et al. | 451/41 |
| 6,582,761 B1 * | 6/2003 | Nishimoto et al. | 427/203 |
| 6,592,980 B1 * | 7/2003 | MacDougall et al. | 428/304.4 |
| 2002/0042210 A1 * | 4/2002 | Mandal et al. | |
| 2002/0102396 A1 * | 8/2002 | MacDougall et al. | |
| 2003/0008525 A1 * | 1/2003 | Mandal et al. | |
| 2003/0157311 A1 * | 8/2003 | MacDougall et al. | |

OTHER PUBLICATIONS

"Sol–Gel Science", p. 118, Academic Press, Inc., Harcourt Brace Jovanovich Publishers, 1990.

"Nanoporous Silica For Low K Dielectrics", Ramos, et al, 443 Mat. Res. Soc. Symp. Proc. vol. 91, 1997.

"Pore Structure Characterization of Porous Films", Glaves, et al, 5 Langmuir 459–66, 1989.

"Microporous and Mesoporous Materials", Impens, et al, 1999, 28, 217–232. "Silylation of micro . . . ".

"A New Family of Mesoporous Molecular Sieves Prepared With Liquid Crystal Templates", Beck, et al, 114 J.Am. Chem. Soc. 10834–43, 1992.

Characterization of Engineering Surfaces By Grazing–Incidence X–ray Reflectivity, Bowen, et al, Nanotechnology, 4, p. 175–182, 1993.

Derwent–2000–482474.

Derwent–2000–490810.

D. Zhao, et al, "Continuous Mesoporous Silica Films With Highly Ordered...", Adv. Materials, 1998, vol. 10, No. 16, pp. 1380–1385.

D. Zhao, et al, "Nonionic Triblock and Star Diblock Copolymer and ...", J. of Amer. Chem. Soc., 1998, vol. 120, pp. 6024–6036.

* cited by examiner

US 6,818,289 B2

MESOPOROUS FILMS HAVING REDUCED DIELECTRIC CONSTANTS

CROSS-REFERENCE TO RELATED APPLICATIONS

This is a divisional application of U.S. patent application Ser. No. 09/711,573 filed 13 Nov. 2000, now U.S. Pat. No. 6,592,980 which is a continuation-in-part of U.S. patent application Ser. No. 09/518,955 filed 3 Mar. 2000, now U.S. Pat. No. 6,365,266, which is a continuation-n-part of U.S. patent application Ser. No. 09/455,999 filed 7 Dec. 1999 now abandoned.

STATEMENT REGARDING FEDERALLY SPONSORED RESEARCH OR DEVELOPMENT

Not applicable.

BACKGROUND OF THE INVENTION

This invention relates to films having reduced dielectric constants, and more particularly to a process for producing mesoporous ceramic films having increased porosity, reduced halide content and reduced metal content.

There is a need in the electronics industry to prepare integrated circuits with increased feature density. In order to do this effectively, metal wiring in the devices must be placed closer together. As the feature size decreases, insulating materials with more insulating ability are required. Currently, devices at 0.18 micron line width use materials based on dense silica, or partially fluorinated derivatives thereof. Typical dielectric constants for these materials range between about 4.2 and 3.8, wherein the dielectric constant is a relative scale in which a vacuum is defined as having a dielectric constant of about 1. As the line width in the devices decreases to 0.13 microns and below, significant decreases in the dielectric constant of the interlayer dielectric material will be required. Current estimates suggest that dielectric constants in the range of 2.2 or less will be required. To accomplish this goal, various classes of materials are currently under investigation. These include both organic polymers and porous oxide materials.

One potential route to reducing the dielectric constant is to develop voids within the material. In the case of silica-based materials, there are several ways to accomplish this. It is known that aerogels and xerogels have very high porosity, and subsequently dielectric constants as low as 1.1 or less. Several drawbacks have been found to this approach. First, the materials are not mechanically robust, and have difficulty surviving the integration process employed in chip manufacturing. Also, the porosity is made up of a broad distribution of pores sizes. This causes problems in etching and achieving a uniform sidewall barrier coating.

Another possible class of porous silica materials is zeolites. Methods are known to prepare thin films of zeolites, but the relatively low porosity prevents them from achieving dielectric constants of 2.3 or less. A porosity of more than 55% is required to achieve the dielectric constants in a $SiO_2$ material of interest, according to the Maxwell equation (the Maxwell equation is described in Kingery et al., *Introduction to Ceramics*, p. 948 (John Wiley & Sons, Inc. 1970)).

With these criteria in mind, some have proposed employing ordered mesoporous silica materials to prepare low dielectric constant films. Preparation of thin film materials is a requirement of this technology. It is currently known that preparation of mesoporous films can be accomplished via a sol gel route. Several examples are described in U.S. Pat. No. 5,858,457 to Brinker et al. and U.S. Pat. No. 5,645,891 to Liu et al., and WO 99/37705. These examples demonstrate that it is possible to prepare mesoporous silica films.

However, both the Brinker et al. and Liu et al. patents fail in several aspects identified by the present inventors as being critical to forming films acceptable for use in electronics applications. Neither patent teaches the use of reagents acceptable for use in the electronics industry. Both recite the use of a cationic, quaternary ammonium surfactant which is required to template the ordered pore structure of this class of materials. Such surfactants have halide counter ions which are corrosive to the metals and some barrier materials used in the preparation of integrated circuits. Although Liu et al. teaches performing ion exchange to remove the halide, it is not clear from Liu et al. how much, if any, of the halide remains within the film after ion exchange. Moreover, the ion exchange step increases the complexity and expense of the method.

Another problem with the prior art is the use of HCl as the acid catalyst for the sol gel reaction to form silica from a silica precursor such as tetraethylorthosilicate. Halides are, as mentioned above, corrosive to the metals and barriers used in these applications.

In addition to teaching the use of cationic surfactants to template the ordered pore structure of mesoporous films, U.S. Pat. No. 5,858,457 to Brinker et al. also teaches the use of nonionic surfactants for the same purpose. However, Brinker et al. does not appreciate the advantages of using nonionic surfactants rather than cationic or anionic surfactants.

All references cited herein are incorporated herein by reference in their entireties.

BRIEF SUMMARY OF THE INVENTION

The invention provides a process for producing a ceramic film having a dielectric constant below 2.3, a halide content of less than 1 ppm and a contaminant metal content of less than 1 ppm.

The invention also encompasses ceramic films having a dielectric constant below 2.3, a halide content of less than 1 ppm and a contaminant metal content of less than 1 ppm.

BRIEF DESCRIPTION OF SEVERAL VIEWS OF THE DRAWINGS

The invention will be described in conjunction with the following drawings in which like reference numerals designate like elements and wherein.

DETAILED DESCRIPTION OF THE INVENTION

Figure 1:
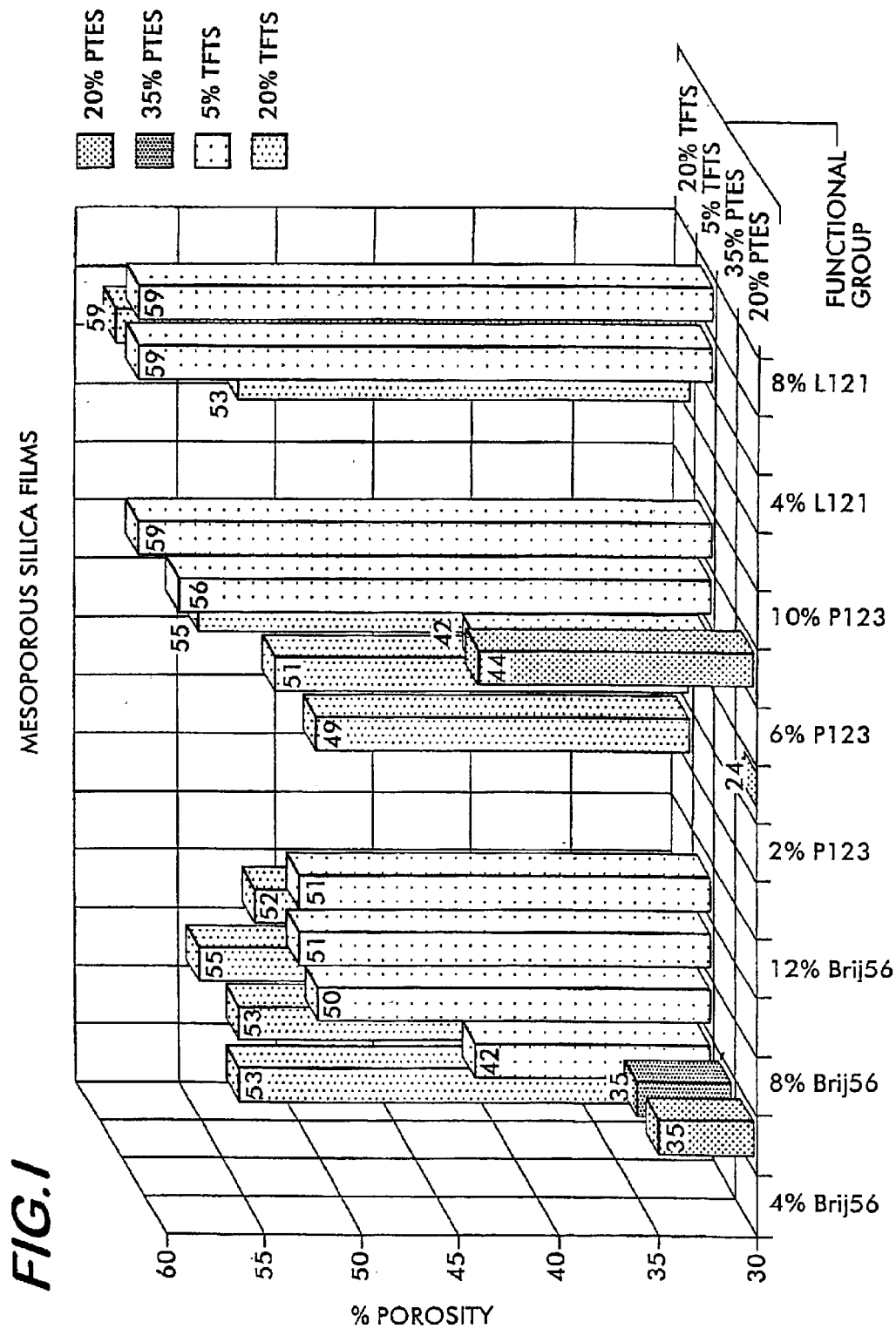
FIG. 1 is a three-dimensional graph of porosity versus surfactant versus functional group.

Films according to the invention can be provided by the following preferred process, wherein a spinning solution containing a ceramic precursor (e.g., a silica precursor) is applied to a substrate and spun on a spin processor.

Although silica is the most preferred ceramic film, the invention contemplates the use of other ceramics. As used herein, the term ceramic refers to complex compounds and solid solutions of both metallic and nonmetallic elements joined by ionic and covalent bonds. Most often, ceramic materials are a combination of inorganic elements. Occasionally, ceramic materials may contain carbon. Examples of ceramic materials include but are not limited to metal oxides, compounds of metal oxides, metal carbides, and nitrides, and carbonates. More specifically, for example, ceramic materials include but are not limited to silica, titania, alumina, titanium silicate, titanium carbide, aluminum nitride, silicon carbide, and silicon nitride. Ceramic materials may be found naturally in animal shells, bones, and teeth or may be found in porcelain or other man made products.

The spinning solution from which the film is formed is preferably provided by the following two-step process. In the first step, a stock solution of partially hydrolyzed silica is provided. This is preferably accomplished by reacting a silica precursor (such as, e.g., tetraethylorthosilicate), an alcohol (such as, e.g., ethanol), water and an acid catalyst. The resulting stock solution is aged for a period of time (preferably about 60–150 minutes, more preferably about 90 minutes) at elevated temperature (preferably about 40–70° C., more preferably about 60° C.), and is then used in the second step.

In the second step for preparing the spinning solution, a portion of this stock solution is diluted with additional alcohol (i.e., an alcohol diluent, which is not necessarily the same as the alcohol used in the first step), a monofunctionalized alkoxysilane can be added, along with more acid catalyst, water, and the surfactant. The surfactant functions as the pore former in the mixture.

Suitable ceramic precursors for use in the spinning solution providing process include, e.g., tetraethoxysilane (TEOS), tetramethoxysilane (TMOS), titanium (IV) isopropoxide, titanium (IV) methoxide and aluminum sec-butoxide.

Suitable alcohols for use in the first step of the spinning solution providing process include, e.g., ethanol, methanol, propanol (e.g., isopropanol), isobutanol and n-butanol.

Suitable alcohol diluents for use in the second step of the spinning solution providing process include, e.g., ethanol, methanol, propanol (e.g., isopropanol), isobutanol and n-butanol.

The acid catalyst used in the spinning solution providing process is preferably an organic acid. Specific examples of acid catalysts include, e.g., acetic acid, oxalic acid and formic acid.

Suitable functionalized alkoxysilanes for use in the spinning solution providing process include $RSi(OR')_3$; $R_2Si(OR')_2$; $R_3SiOR'$; $RR'Si(OR'')_2$; and $RR'R''SiOR'''$; where R, R', R'' and R''' are individually alkyl (i.e. methyl, ethyl, isopropyl, butyl) or aryl (i.e. phenyl); e.g., methyltriethoxysilane and phenyltriethoxysilane; or $R_2Si(OR')_2$; $R_3SiOR'$, where R is phenyl, $CF_3$ or butyl and R' is as defined above. $R_2R'SiOSiR_2R'$ and $RR'R''SiOSiRR'R''$ where R, R' and R'' are defined as above can also be used. Use of alkylalkoxysilanes improves the k stability, while maintaining low k and high modulus.

Suitable surfactants for use in the spinning solution providing process include, e.g., Pluronic L121, L123, L31, L81, L101 and P123 (BASF, Inc.), Brij 56 ($C_{16}H_{33}(OCH_2CH_2)_{10}OH$) (ICI), Brij 58 ($C_{16}H_{33}(OCH_2CH_2)_{20}OH$) (ICI) and Surfynols 465 and 485 (Air Products and Chemicals, Inc.). The surfactant can be an ethylene oxide propylene oxide (EO-PO) block copolymer or polyoxyethylene alkyl ether.

Preferably, the surfactant is an ethoxylated acetylenic diol, such as the Surfynols available from Air Products and Chemicals, Inc. of Allentown, Pa. It is particularly preferred to provide surfactants wherein the metal content is less than 20 ppm. Such surfactants are available from ICI Surfactants (Uniqema) of Wilmington, Del. under the trademark Brij, Air Products and Chemicals, Inc. of Allentown, Pa. under the trademark Surfynol and from BASF Corp. Performance Chemicals of Mt. Olive, N.J. under the trademark Pluronic.

The spinning solution is applied to a substrate (e.g., a Si wafer, $Si_3N_4$, Al, Pt, etc.) and the solution is spun on a spin processor. This rapid motion causes the volatile alcohol to be removed, inducing film formation. As the alcohol is removed, the surfactant concentration increases above the critical micelle concentration ($C_{mc}$) and an ordered liquid crystal phase is formed in solution. The silica precursors present form a network around the liquid crystal and, as hydrolysis and condensation reactions proceed, the network forms a solid thin film. Upon calcination to remove the surfactant, the silica network is reacted further to form a rigid thin film.

By varying process parameters, it is possible to tune the dielectric constant of the film of the invention. This is accomplished by varying the pore size and distribution of the pores in the film. The films of the invention are mesoporous, which is defined for purposes of this disclosure to denote pore sizes of less than about 500 Å, more preferably in the range of about 13 Å to about 500 Å, and most preferably 20 Å to 50 Å. It is preferred that the film have pores of uniform size, and that the pores are homogeneously distributed throughout the film. Films of the invention preferably have a porosity of about 50% to about 80%, more preferably about 55% to about 75%.

The inventors have determined that it is possible to prepare films with varying porosity by manipulating the amount and type of surfactant in a formulation. A minimum level of porosity is critical to achieve a dielectric constant of less than 2.3. Also, it is necessary to keep the films free from adsorption of water. Water has a dielectric constant of 78.5, so adsorption of even small amounts of water will increase the dielectric constant to unacceptably high values. Films of the invention have reduced hygroscopicity and increased dielectric stability.

The present invention increases the shelf-life (i.e., the gelation time) of film-forming solutions. This is a critical requirement for use of these solutions to form films. If the solutions are only viable for a short amount of time, as suggested by U.S. Pat. No. 5,858,457 to Brinker et al., which states that the longer the film-forming solution is aged, the less porous the films that are formed, the cost of ownership would be too high to be employed for the desired applications. The gelation time for films of the invention is at least 24 hours, and more preferably at least 300 hours, when stored at about 22° C.

The inventive process employs chemicals that are accepted for use in the electronics industry, because they do not contain contaminants which reduce the efficiency of preparation of integrated circuits. HCl, HBr, $H_2SO_4$, and $H_3PO_4$ acid catalysts, cationic surfactants and anionic surfactants are preferably avoided, as they contribute undesirable counter-ions to the films of the invention. However, $HNO_3$ is an acceptable acid catalyst presumably due to its innocuous decompostion products. Films of the invention preferably contain contaminating metals in amounts less than 500 parts per million (ppm), preferably less than 1 ppm, more preferably less than 500 part per billion (ppb). Films of the invention preferably contain contaminating halides in amounts less than 1 ppm, preferably less than 750 ppb, more preferably less than 500 ppb.

It is possible to prepare these films in a period of time, typically less than 30 minutes, which is acceptable to achieve reasonable production rates of integrated circuits.

In order to reduce the dielectric constant, it is preferable to dehydroxylate (anneal) the dried film. This may be done by placing the substrate in a dry atmosphere with an agent, such as hexamethyldisilazane (HMDS—see, e.g., U.S. Pat. No. 5,955,140), or by otherwise contacting the substrate under suitable conditions with HMDS. HMDS substitutes trimethylsilyl groups for much of the water and/or hydroxyls bound to the dried gel's pore surfaces. This replacement may be performed at room temperature, or warmer. This replacement can not only remove water and/or hydroxyls, it can also render the dried film hydrophobic.

The invention will be illustrated in more detail with reference to the following Examples, but it should be understood that the present invention is not deemed to be limited thereto.

In the Examples, dielectric constants were determined according to ASTM Standard D150-98. Film porosity was estimated by the Maxwell model with the film dielectric constant and the dielectric constant of dense silicon oxide (4.2). The films were spun on low resistance (0.01 Ωcm) single crystal silicon wafers and calcined to 400° C. After calcination, the film thickness (d) was measured by a Tencor P-2 profilometer. The thickness error is less than 2%. The capacitance-voltage were measured at 1 MHz with a Solotron 1260 frequency analyzer and MSI electronics Hg-401 mercury probe. The errors of the capacitance and the mercury electrode area (A) are less than 1%. The substrate (wafer) capacitance ($C_{si}$), background capacitance ($C_b$) and total capacitance ($C_T$) were measured and the film capacitance ($C_f$) is calculated by Equation (1):

$$C_f = C_{Si}(C_T-C_b)/[C_{Si}-(C_T-C_b)] \quad \text{Equation (1).}$$

The dielectric constant of the film is calculated by Equation (2):

$$\epsilon = C_f d/\epsilon_0 A \quad \text{Equation (2)}$$

The total error of the dielectric constant is expected to be less than 5%.

The film porosity can be measured by spectroscopic ellipsometry if there is water adsorption. The films were spun on a single crystal silicon wafer and calcined as in Example 2. The signals were collected by an SE 800 (Sentech Instruments GMbH) and calculated by Spectroray software using the Bruggemann model. The thickness and percentage of air were simulated in the wavelength range from 400 nm to 800 nm with mean square error about 1 or less. The simulated thicknesses usually were in good agreement with the thicknesses measured by profilometer (within a few percent difference).

EXAMPLE 1

Standard Stock Solution Using HCl as the Acid Catalyst

A stock solution was prepared using HCl as the acid catalyst. Into a clean PTFE container were measured in the following order: 61 ml tetraethylorthosilicate (TEOS), 61 ml ethanol (absolute), 5 ml deionized water, and 0.2 ml 0.07M HCl solution. The container was sealed, and placed in a water bath at 60° C. for 90 minutes. The solution was allowed to cool to room temperature, and was then used to prepare a spinning solution.

EXAMPLE 2

Standard Spinning Solution Using 0.07M HCl

A spinning solution was prepared using the above stock solution, by mixing into a tared polypropylene bottle 10 ml of the stock solution, 10 ml ethanol, 0.42 ml [($CH_3CH_2$O$)_3$Si($CH_2)_2(CF_2)_5CF_3$] referred to as tridecafluoro-1,1,2,2-tetrahydrooctyl-1-triethoxysilane (TFTS), 0.4 ml deionized water, and 1.0 ml 0.07M HCl. The weight of the solution was determined, and Pluronic L121 (ethylene oxide-propylene oxide (EO-PO) block copolymer) surfactant was added at 6 weight percent of that amount. The resulting solution was sonicated for 20 minutes, and the resulting clear colorless solution was filtered through a 0.2 micron syringe filter.

A thin film was prepared by depositing 1.2 ml of the spinning solution onto a Si wafer, while spinning at 500 rpm for 10 seconds, the speed was increased to 3000 rpm for 25 seconds. The film was clear and homogeneous across the wafer. Calcination to produce the porous silica film was done in a $N_2$ purged box furnace, by heating the film at 5° C. per minute to 425° C., and holding at 425° C. for 30 minutes. The furnace was allowed to cool to room temperature, and the film characteristics were measured using spectroscopic ellipsometry. The resulting film was 0.72 microns thick, with a refractive index of 1.1960. This refractive index relates to a porosity of 55.9%, and suggests a dielectric constant of 2.19.

Examples 1 and 2 are representative of the use of HCl as the acid catalyst and a polyalkylene oxide block copolymer as a surfactant. The use of HCl as a catalyst in the preparation of sol gel solutions would preclude its use in microelectronic applications. Potential reactions with both metals used to form integrated circuits as well as barrier materials could cause significant reduction in the efficiency of these circuits. It is critical that alternative catalysts be found, which provide at least equivalent performance in the preparation of the films in terms of porosity and dielectric constant. Acceptable candidates are acids that do not corrode metals commonly employed in microelectronics, such as Cu and W.

Accordingly, experiments to identify alternative acid catalysts were carried out with hydrofluoric acid (HF), acetic acid (HOAc), oxalic acid, and formic acid. All were used in both steps of the process to prepare films, with fixed functional group and surfactant. Brinker and Scherer (Brinker and Scherer, Sol-Gel Science, p. 118 (Academic Press, Inc., Harcourt Brace Jovanovich Publishers, 1990)) lists the gel times and pH for TEOS systems employing different acid catalysts. At constant acid molar amount to TEOS, HF gives the shortest gelation time (12 hours), followed by HOAc (72 hours) and then HCl (92 hours). This suggests that at the same concentration, HF and HOAc should give comparable performance to HCl in this application. However, Examples 6–10 (below) demonstrate that, at equivalent concentration, none of the alternate acids showed comparable performance to HCl. Therefore, similar tests were conducted using 1M HOAc and concentrated (i.e., 99.7%) HOAc (see Examples 11–14, below). The results indicate that there is an "induction period" for the acetic acid solutions, but after about four days, comparable results were obtained when compared to similar solutions using HCl at 0.07M. Both solutions remain active for at least two weeks at room temperature. If cooled below room temperature, these solutions are effective beyond that period. These results are demonstrated in the shelf-life study, Examples 12 & 14, below.

EXAMPLE 3

Stock Solution Prepared Using 0.07M HF

A stock solution was prepared using HF instead of HCl as the acid catalyst. Into a clean PTFE container were measured in the following order: 61 ml TEOS, 61 ml ethanol (absolute), 5 ml deionized water, and 0.2 ml 0.07M HF solution. The container was sealed, and placed in a water bath at 60° C. for 90 minutes. The solution was allowed to cool to room temperature, and was then used to prepare all of the following spinning solutions. Three different spinning solutions were prepared using this above stock solution, each had a different amount of 0.07M HF. Since HF is a weaker acid than HCl in water, the amount was varied in an attempt to compensate for the weaker acid.

EXAMPLE 4

Spinning Solution Prepared Using 1.0 ml 0.07M HF

In a polypropylene (PP) bottle the following were measured in the order given: 10 ml stock solution above, 10 ml ethanol, 0.42 ml TFTS, 0.4 ml deionized water, and 1.0 ml 0.07 M HF solution. The weight of this solution was obtained, and Pluronic L121 surfactant was added at 8 weight percent of the solution weight. The solution was sonicated for 20 minutes in a small ultrasonic bath. The resulting homogeneous, clear solution was filtered through a 0.2 micron syringe filter. This solution was then spun onto a prime low resistivity 4 inch Si wafer, by dispensing 1.2 ml of the final solution onto the center of the wafer, while spinning at about 500 rpm for about 10 seconds, and then spun at 3000 rpm for 25 seconds. The films were then calcined in a $N_2$ purged box furnace by heating at 5° C. per minute to 425° C., holding at temperature for 30 minutes and allowing the furnace to cool to room temperature. The film was then tested by measuring the refractive index.

EXAMPLE 5

0.8 ml 0.07M HF Spinning Solution

This solution was prepared using the stock solution in Example 3. Instead of using 1.0 ml of 0.07M HF solution as in Example 4, 0.8 ml were used. The solution was treated the same as in Example 4.

EXAMPLE 6

1.2 ml 0.07M HF Spinning Solution

This solution was prepared using the stock solution in Example 3. Instead of using 1.0 ml of 0.07M HF solution as in Example 4, 1.2 ml were used. The solution was treated the same as in Example 4.

EXAMPLE 7

Stock Solution Prepared Using 0.07M Acetic Acid

A stock solution was prepared following Example 1, except using 0.07 M acetic acid in place of HCl in the process. The same amounts of the other reagents were used.

EXAMPLE 8

Acetic Acid Spinning Solution

Into a tared polypropylene bottle were added in the following order: 10 ml stock solution prepared in Example 7, 10 ml ethanol, 0.42 ml TFTS, 0.4 ml deionized water and 1.2 ml 0.07M HOAc. To that solution, 1.52 g L121 surfactant was added. That weight was 8 weight % of the solution weight. The solution was sonicated for 20 minutes, and the resulting clear, colorless solution was filtered through a 0.2 micron syringe filter.

EXAMPLE 9

Stock Solution Prepared Using 0.07M Formic Acid

A stock solution was prepared following Example 1, except using 0.07M formic acid in place of HCl in the process. The same amounts of the other reagents were used.

EXAMPLE 10

Formic Acid Spinning Solution

Into a tared polypropylene bottle were added in the following order: 10 ml stock solution prepared in Example 9, 10 ml ethanol, 0.42 ml TFTS, 0.4 ml deionized water, and 1.2 ml 0.07M formic acid. To that solution 1.58 g L121 surfactant was added. That weight was 8 weight % of the solution volume. The solution was sonicated for 20 minutes, and the resulting clear colorless solution was filtered through a 0.2 micron syringe filter.

All five spinning solutions from Examples 4, 5, 6, 8 and 10 were used to prepare films on Si wafers in the same way. About 1.2 ml of each solution was dispensed separately onto an individual wafer. The wafer was spun at 500 rpm for 10 seconds, and then accelerated to 3000 rpm and held for 25 seconds. At the end of the process, the wafers were placed in a $N_2$ purged box furnace, and heated at 5° C. per minute to 425° C., held for 30 minutes and allowed to cool to room temperature. None of these films survived the calcination process. It was surprising that the alternate acids were ineffective in catalyzing the sol gel reaction at the concentration and amount used in the Examples. Given the data in Brinker, one would have expected similar results at the same concentration.

The solutions were stored in the refrigerator and used to prepare films again after different times. After four days, the acetic acid and HF catalyzed solutions were able to spin good films with poor optical quality, but porosities of about 60%, while the formic acid catalyzed solution could not.

Examples 11 and 12 demonstrate the effect of concentration of acetic acid on film characteristics. As noted above, the 0.07M HOAc and formic acid films were of poor quality initially. Therefore, the concentration of the acetic acid catalyst in both the stock solution and spinning solutions was varied. Two different concentrations were used, 1.0M and concentrated (99.7%).

EXAMPLE 11

1.0M HOAc Stock Solution

A stock solution was prepared following Example 7, replacing the 0.07M HOAc solution with 1.0M HOAc solution. All other reagents were the same, and the solution was treated as in Example 7.

EXAMPLE 12

1.0M HOAc Spinning Solution

A spinning solution was prepared following Example 8, except using 1.0 ml of 1.0 M HOAc in place of 1.2 ml of 0.07 M HOAc in the process. The same amounts of the other reagents were used. After two days aging at room temperature, this spinning solution produced films 54% porous and about 0.2 microns thick.

EXAMPLE 13

Concentrated HOAc Stock Solution

A stock solution was prepared following Example 7, replacing the 0.07M HOAc solution with concentrated (99.7%) HOAc. All other reagents were the same, and the solution was treated as in Example 7.

EXAMPLE 14

Concentrated HOAc Spinning Solution

A spinning solution was prepared following Example 8, except using 1.0 ml of concentrated (99.7%) HOAc in place of 1.2 ml of 0.07 M HOAc in the process. The same amounts of the other reagents were used. After four days aging at room temperature, this sol produced films 58% porous and about 0.5 um thick.

EXAMPLE 15

Shelf-life Study

A set of experiments designed to study the effect of the age of the spinning solutions was carried out using concentrated acetic acid and 0.07M HCl to determine if there were any effects due to the use of an organic acid as the catalyst for the sol gel reaction.

Two different stock solutions were prepared: (1) a first stock solution with concentrated acetic acid (99.7%) and (2) a second stock solution with 0.07M HCl. Spinning solutions were made as stated above using HCl and HOAc and were either stored in the refrigerator or at room temperature. Films were spun from the sols every few days. The films were then characterized by spectroscopic ellipsometry to determine the refractive index, which can be related to amount of porosity and ultimately dielectric constant. Table 1 summarizes the results of the study.

TABLE 1

| Acid Stored Days Old | Acetic Cold Example 14 | Acetic Room Temp Porosity (%) Example 14 | HCl Cold Example 2 | HCl Room Temp Example 2 |
| --- | --- | --- | --- | --- |
| 1 | 40.7 | 50.5 | 61.0 | 57.4 |
| 2 | 48.7 | 55.8 | 59.9 | 56.2 |
| 3 | 35.6 | 40.3 | 52.5 | 35.3 |
| 8 | 51.3 | 37.5 | 54.0 | 37.7 |
| 10 | 56.6 | 46.1 | 55.4 | 49.1 |
| 14 | 53.5 | 32.0 | 50.2 | 38.5 |
| 21 | 57.9 | 48.3 | 56.7 | 53.6 |

The inventors have discovered that it is possible to prepare films with varying porosity by manipulating the amount and type of surfactant in a formulation. A minimum level of porosity is critical to achieve a dielectric constant of less than 2.3. Also, it is necessary to keep the films free from adsorption of water. Water has a dielectric constant of 78.5., so adsorption of even small amounts of water will increase the dielectric constant to unacceptably high values.

It is possible to predict the dielectric constant of a mixture of ceramic materials and air. Mixtures of ideal dielectrics can be thought of as simply layers either parallel or perpendicular to an applied field. Ramos et al., 443 Mat. Res. Soc. Symp. Proc. Vol. 91 (1997) presents data for some bulk aerogel materials which correlate with the parallel model, and notes the relationship of density (or porosity) to the dielectric constant of a material. A complementary approach is to use the relationship derived by Maxwell (see Kingery et al., above), which is based on spherical particles in a matrix. The inventors have used the latter to predict the dielectric constant of mesoporous silica films. The porosity is obtained via spectroscopic ellipsometry, which measures the refractive index of the film. In specific cases, the measured dielectric constant and the dielectric constant calculated via porosity were compared and matched within experimental error of both measurements. Some of the studies report only porosity as a gauge of the dielectric constant.

As Ramos et al. points out, it is important to be able to tune the porosity of films to achieve the appropriate dielectric constant as well as mechanical properties. The ability of the mesoporous films of the instant invention to vary in porosity is desirable for both extendibility and ability to meet current integration requirements.

EXAMPLE 16

Solutions Containing Brij 56 and PTES or TFTS

This study specifically restricted the choices to nonionic surfactants in order to reduce potential contaminants such as alkali metals and halides associated with the cationic surfactants typically used. Block copolymers of ethylene oxide and propylene oxide as well as polyoxyethylene ethers were used as surfactants. The amount of surfactant as a weight fraction of the spinning solution was examined. In addition, two different functional groups were analyzed. The functional groups are monosubstituted ethoxysilanes, with the general formula R—Si(OCH$_2$CH$_3$). In this case, the two functional groups (R) studied were phenyl (PTES) and (CH$_2$)$_2$(CF$_2$)$_5$CF$_3$ (TFTS).

A spinning solution was prepared using 10 ml of a stock solution prepared in Example 1, the stock solution was diluted with 10 ml ethanol, the molar amount of functional group as a percent of the total silica in the solution indicated in Table 2 was added, along with 0.4 ml deionized water, and 1.0 ml 0.07M HCl. The weight percent of the surfactant (in this case Brij 56, (C$_{16}$H$_{33}$(OCH$_2$CH$_2$)$_{10}$OH)) as indicated in Table 2 was added to the solution. Each of the ten solutions was sonicated for 20 minutes and filtered through a 0.2 micron syringe filter. Each solution was then spun onto a Si wafer, using about 1.2 ml of the spinning solution for a four-inch wafer. Spinning speeds and duration are comparable to those noted in the above examples. The wafers were then calcined in a box furnace by heating the films in N$_2$ at a rate of 5° C. per minute to 425° C. and holding for 30 minutes before cooling to room temperature. The refractive index for each film was measured using spectroscopic ellipsometry and the porosity of each was calculated. The percent porosity value of each film is shown in Table 2. In the case of the film prepared with 5% TFTS and 6% Brij 56, the film was coated onto a low resistivity prime Si wafer and the dielectric constant was measured using a Hg probe at 1 MHz. The actual dielectric constant for that film was 4.56 (±0.3). At 41% porosity, the predicted dielectric constant using the Maxwell relation would be 2.6. This difference is likely due to water adsorption, and illustrates the need to minimize moisture adsorption.

TABLE 2

| | 4% Brij 56 | 6% Brij 56 | 8% Brij 56 | 10% Brij 56 | 12% Brij 56 |
|---|---|---|---|---|---|
| 20% PTES | | 35.1 | | | |
| 35% PTES | | 34.6 | | | |
| 5% TFTS | | 41.9 | 49.8 | 50.7 | 51.2 |
| 20% TFTS | 53.4 | 52.8 | 54.6 | 52.1 | |

EXAMPLE 17

Solutions Containing Pluronic P123 and PTES or TFTS

Table 3 shows the percent porosity results from this study, which largely corresponded to Example 16 with Pluronic P123 substituted for Brij 56.

TABLE 3

| | 2% P123 | 4% P123 | 6% P123 | 8% P123 | 10% P123 |
|---|---|---|---|---|---|
| 20% PTES | | 23.7 | | 43.5 | |
| 35% PTES | | | | | |
| 5% TFTS | | | 42.6 | 56.1 | 58.7 |
| 20% TFTS | 49.0 | 51.5 | 55.4 | Film failure | |

EXAMPLE 18

Solutions Containing Pluronic L121 and PTES or TFTS

Table 4 shows the percent porosity results from this study, which largely corresponded to Example 16 with Pluronic L121 substituted for Brij 56.

TABLE 4

| | 4% L121 | 6% L121 | 8% L121 |
|---|---|---|---|
| 20% PTES | | | |
| 35% PTES | | | |
| 5% TFTS | | 59.1 | 59.2 |
| 20% TFTS | 52.5 | 58.8 | |

FIG. 1 shows the results from Examples 16–18. The results demonstrate that by varying both the type and amount of surfactant it is possible to tune the porosity of the films to achieve the desired dielectric constants for this application, and that there is a critical amount above which viable films will not form. This is not implied or suggested in the prior art references.

EXAMPLE 19

Predicted versus Actual Measured Dielectric Constants

A series of films were prepared on low resistivity, prime Si wafers and their dielectric constants measured by Hg probe, with minimal exposure to the ambient atmosphere. Table 5 compares the measured dielectric constant values with the values calculated based on the films' porosity estimated from the refractive index measured by spectroscopic ellipsometry.

TABLE 5

| Film | Void Fraction | Measured κ | Predicted κ Maxwell |
|---|---|---|---|
| 5% TFTS/8% Brij 56 | 0.471 | 2.45 | 2.46 |
| 5% TFTS/6% P123 | 0.480 | 2.46 | 2.43 |
| 5% PTMS/8% P123 | 0.290 | 2.93 | 3.07 |
| 5% TFTS/6% P123 | 0.498 | 2.31 | 2.37 |
| 5% TFTS/6% L121 | 0.507 | 2.19 | 2.35 |

The correspondence for the predicted k value using the Maxwell equation and the actual measured dielectric value are within the experimental errors associated with both techniques. This example demonstrates the validity of using porosity in the film determined by spectroscopic ellipsometry to predict the dielectric constant.

EXAMPLE 20

Pore Size Determination

Figure 2:
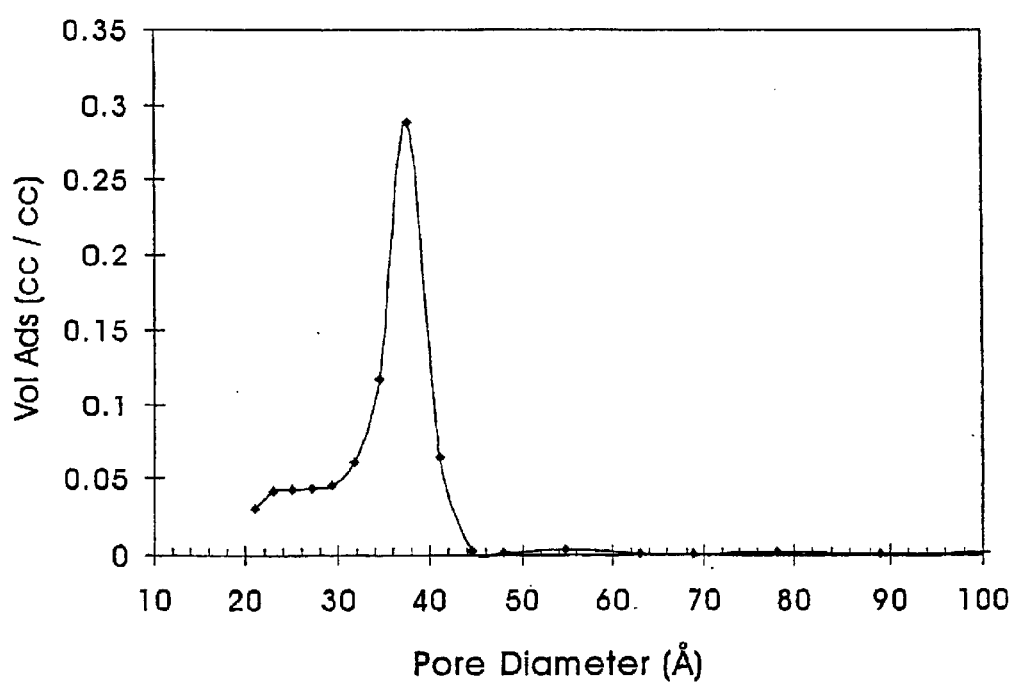
FIG. 2 is a graph of pore size distribution of the mesoporous silica film of Example 2.

Using a spinning solution as described in Example 2, a thin film was formed on a Surface Acoustic Wave (SAW) device as described in U.S. Pat. No. 5,858,457, and also on a single crystal Si wafer. The films were treated in a similar manner as in Example 2. A nitrogen adsorption isotherm was measured on the film coated on the SAW device. From this data, a pore size distribution was obtained, as is described by Glaves et al., 5 Langmuir 459-66 (1989). The pore size distribution is shown in FIG. 2.

The dielectric constant was measured as discussed in Example 16, it was found to be 2.17, which is very comparable to the dielectric constant that would be calculated using the Maxwell equation (2.19).

EXAMPLE 21

Study of Films Prepared Using Acetic Acid as the Acid Catalyst and Methyltriethoxysilane (MTES) as the Functional Group A stock solution was prepared as in Example 13, with concentrated acetic acid. One hundred of this solution was diluted with 100 ml absolute ethanol. To this 2.2 ml of MTES, 4.0 ml of deionized $H_2O$, and 10 ml of concentrated HOAc acid were added. This solution was used to prepare 20 different spinning solutions using five different surfactants at various concentrations as indicated in Table 6. Pluronic F127 is available from BASF.

TABLE 6

| Solution Number | Surfactant | Weight percent in formulation |
|---|---|---|
| 1 | L121 | 4% |
| 2 | L121 | 6% |
| 3 | L121 | 8% |
| 4 | L121 | 10% |
| 5 | P123 | 4% |
| 6 | P123 | 6% |
| 7 | P123 | 8% |
| 8 | P123 | 10% |
| 9 | Brij58 | 4% |
| 10 | Brij58 | 6% |
| 11 | Brij58 | 8% |
| 12 | Brij58 | 10% |
| 13 | Brij56 | 4% |
| 14 | Brij56 | 6% |
| 15 | Brij56 | 8% |
| 16 | Brij56 | 10% |

TABLE 6-continued

| Solution Number | Surfactant | Weight percent in formulation |
|---|---|---|
| 17 | F127 | 4% |
| 18 | F127 | 6% |
| 19 | F127 | 8% |
| 20 | F127 | 10% |

After the spinning solutions had aged for 5 days at ambient temperature, films were prepared on Si wafers and on SAW devices under the following spinning conditions. The solution was dispensed onto a wafer spinning at 500 rpm, the wafer was spun at 500 rpm for 7 seconds, and the wafer was then accelerated to 1200 rpm for 40 seconds. The films were calcined as in the above examples, and spectroscopic ellipsometry was used to determine the refractive index and film thickness. The data for these films are summarized in Table 7.

TABLE 7

| Number | Median Pore Size (Å) - SAW | RI | Percent Porosity (Ellipsometry) | Thickness(nm) |
|---|---|---|---|---|
| 1 | — | 1.235 | 48.3% | 370 |
| 2 | 37 | 1.187 | 58.5% | 450 |
| 3 | 40 | 1.173 | 61.4% | 450 |
| 4 | 44 | 1.166 | 63.0% | 450 |
| 5 | — | 1.248 | 46.0% | 370 |
| 6 | 37 | 1.174 | 61.0% | 460 |
| 7 | — | 1.195 | 56.8% | 517 |
| 8* | — | 1.372 | 20.1% | 333 |
| 9 | — | 1.277 | 39.7% | 275 |
| 10 | — | 1.236 | 48.2% | 293 |
| 11 | — | 1.226 | 50.4% | 288 |
| 12 | 40 | 1.219 | 52.0% | 310 |
| 13 | — | 1.249 | 45.6% | 273 |
| 14 | — | 1.237 | 48.1% | 276 |
| 15 | — | 1.234 | 48.7% | 258 |
| 16 | — | 1.228 | 50.0% | 273 |
| 17* | — | — | — | — |
| 18* | — | — | — | — |
| 19* | — | — | — | — |
| 20* | — | — | — | — |

*= poor film quality, some cracking noticed.

This study shows that the Pluronic F127 is not an effective surfactant at the concentrations tested. In the case of both Brij surfactants, the amount of porosity was insufficient to give a low dielectric constant film. The P123 surfactant did yield a film above 60% porosity at 6 weight % in the formulation. At higher levels, it appeared to be ineffective. It is interesting that there appears to be an optimal surfactant level for this particular surfactant.

EXAMPLE 22

Effect of Porosity Using Different Alcohols

A stock solution was prepared by combining the following in a clean FEP bottle: 61 ml of TEOS, 61 ml of isopropyl alcohol (IPA), 5.2 ml deionized $H_2O$, and 0.2 ml of concentrated HOAc. This clear mixture was heated in a water bath at 60° C. for 90 minutes. The stock solution was allowed to cool and used to prepare the spinning solutions used in the following examples.

EXAMPLE 23

Spinning Solution with Only IPA

In a clean polypropylene bottle, 10 ml of the stock solution from Example 22, 10 ml IPA, 0.22 ml MTES, 1.4 ml H2O, and 1.0 ml concentrated HOAc were added. To this clear, colorless solution was added 1.58 g L121 surfactant. This amount represents about 8% by weight of the total amount of spinning solution. This amount was fixed so that a direct comparison could be made with different alcohols having different molecular weights and higher boiling points than ethanol. The solution was sonicated and filtered as noted in the above examples.

This solution was spun onto a single crystal Si wafer and a SAW device using the procedure from Example 21. The films were calcined according to Example 2, and the dielectric constant by Hg probe as well as the refractive index using ellipsometry were measured. A $N_2$ adsorption and desorption isotherm was obtained on the film spun on the SAW device. These data are summarized in Table 8 along with the data for Examples 24 and 25.

EXAMPLE 24

Isobutanol Used to Prepare the Spinning Solution

This example is similar to Example 23, but uses isobutanol instead of IPA to dilute the stock solution.

EXAMPLE 25

Tert-butanol (t-butanol) Used to Prepare the Spinning Solution

This example is similar to Example 24, but uses t-butanol instead of isobutanol to dilute the stock solution.

EXAMPLE 26

Wafer Post Treatment

As noted above, it is important to control the amount of water adsorbed into the pores of the film, since water has a large dielectric constant. It is likely that the presence of surface hydroxyl groups lead to moisture adsorption. It is well known that there are many possible ways to react these and render a surface hydrophobic. In the above examples, the use of a monofunctional triethoxysilane (e.g., TFTS, PTES, and/or MTES) to yield a surface function group reduces the dielectric constant. It may be necessary to further remove or react additional surface hydroxyl groups. There are many potential routes to do this (see, e.g., Impens et al., Microporous and Mesoporous Materials, 1999, 28, 217–232). The inventors examined the use of a silylating reagent, hexamethyldisilazane (HMDS).

Films prepared according to Examples 23 and 24 were removed from the box furnace after calcination and placed in a petri dish. Neat HMDS was dispensed onto the surface of the film with a syringe. The petri dish was then covered and the film was allowed to sit in contact with the HMDS for several minutes. The excess HMDS was drained from the surface of the wafer and the wafer was placed on a hotplate at about 350° C. for one minute. Properties of the films were then tested using the Hg probe to measure dielectric constant and the spectroscopic ellipsometer to measure the refractive index. The results are shown in Table 8.

TABLE 8

| Number | Alcohol | Days old | HMDS | Median Pore Size (Å) – SAW | κ | RI | Percent Porosity (Ellipsometry) | Thickness (nm) |
|---|---|---|---|---|---|---|---|---|
| 23 | isopropanol | 5 | No | — | — | 1.093 | 78.8% | 690 |
| 24 | isobutanol | 5 | No | — | — | 1.147 | 67.0% | 615 |
| 25 | t-butanol | 5 | No | — | — | 1.133 | 70.0% | 328 |
| 23 | isopropanol | 7 | No | 56 | 2.70 | 1.144 | 67.6% | 705 (675) |
| 24 | isobutanol | 7 | No | 69 | 2.63 | 1.155 | 65.2% | 661 (626) |
| 25 | t-butanol | 7 | No | 88 | — | 1.137 | 69.1% | 373 |
| 26-1 | isopropanol | 7 | Yes | — | 2.12 | 1.152 | 65.9% | 709 (645) |
| 26-1 | isobutanol | 7 | Yes | — | 2.08 | 1.168 | 62.6% | 653 (619) |

The values of Table 8 in parentheses are thicknesses as measured by profilometry using a Tencor for comparison to the thicknesses calculated from the ellipsometry measurement. This study clearly shows that an all IPA solution with HMDS treatment or a film prepared with an IPA stock solution and isobutanol would be effective for producing a low dielectric constant film.

EXAMPLE 27

X-ray Diffraction Data

The low dielectric constant property of mesoporous silica films results from high porosity associated with empty mesopores. The pore geometry and spatial arrangement of mesopores in the amorphous silica matrices can be remarkably periodic, but also may appear []x-ray amorphousz[] in materials with no long range spatial pore ordering. Although these materials may exhibit isotropic bulk properties in powder form, their mechanical and electrical properties may be anisotropic in highly textured (i.e., single crystal) thin films because of the geometry and orientation of the pore system relative to the Si wafer surface.

X-ray diffraction techniques provide one of the best methods to structurally characterize these materials. In contrast to TEM images, x-ray data can be obtained nondestructively from the wafer without sample preparation, and averages over millimeter areas as opposed to nanometers.

Mesoporous silicas were initially prepared as powders and x-ray powder diffraction techniques were instrumental in determining the structural nature of these materials and in routine phase identification. Beck et al., []A new family of mesoporous molecular sieves prepared with liquid crystal templates,[] 114 J.Am. Chem. Soc. 10834–43 (1992). The powder diffraction analysis of these materials requires data collection at relatively low diffraction angles (0.5°–2.0° 2θ) because of the relatively large spacings (20–100 Å) associated with the primary lattice translations. While not terribly difficult on a modern powder diffractometer, these measurements do require careful low-angle instrument alignment and sample preparation. However, analyzing thin films of these materials on wafer substrates presents serious challenges for conventional x-ray powder diffractometers. Our early experiments revealed large changes in diffracted intensity due to minor changes in wafer orientation. Subsequent studies with area detectors confirmed that these intensity changes resulted from highly textured films. Some films were more like single crystals than randomly oriented powders.

Another problem is related to wafer size. Conventional powder diffractometers cannot accommodate large (e.g., 6 inch or 8 inch) diameter wafers. These problems led us to evaluate additional x-ray techniques and instrumentation, including area detector systems and grazing incidence x-ray reflectivity (GIXR). See, e.g., Bowen et al., Nanotechnology, 1993, 4, 175–182.

Diffraction instrumentation with a high-resolution sample stage and area detector instead of a []one-dimensional scintillation counter offers significant advantages for analyzing textured materials. Instead of recording only a small segment of a diffraction ring, an area detector can record the complete ring in transmission mode and one half of the ring in reflection mode. This is sufficient to detect some single crystal reflections and low resolution specular and diffuse grazing incidence x-ray reflection data. Grazing incidence analyzes x-rays reflected at low angles from the sample surface. Unlike conventional diffraction techniques, GIXR is sensitive to the electron density distribution in the top micron layers of the surface and is independent of crystallinity or physical state.

Figure 3:
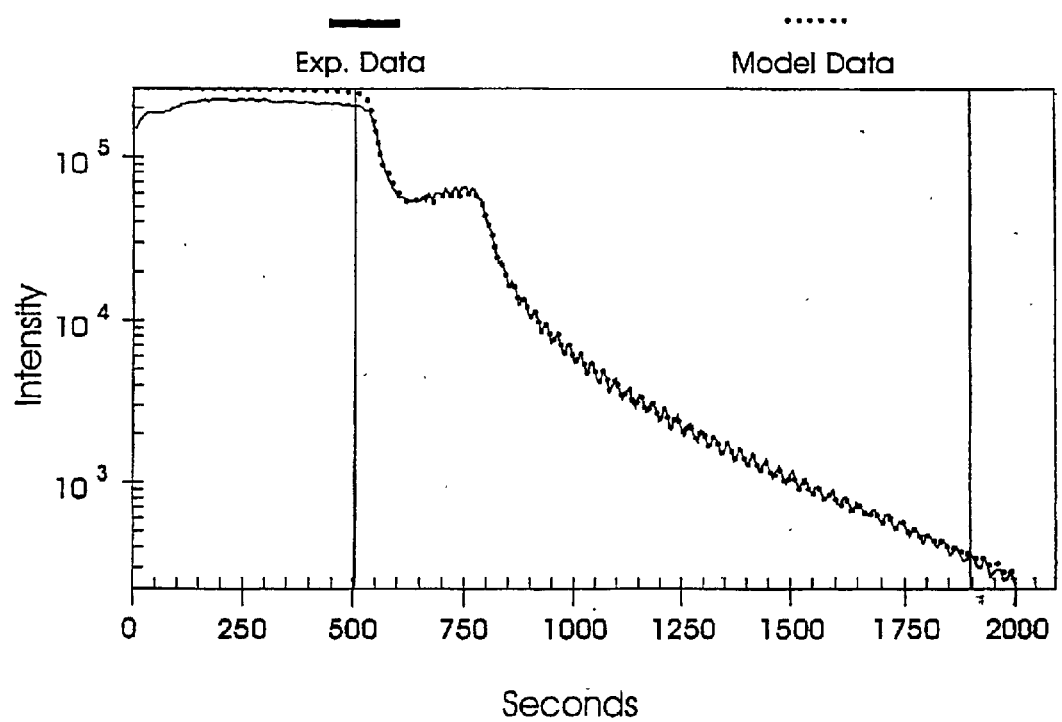
FIG. 3 is a graph showing grazing incidence x-ray reflectivity (GIXR) data for a mesoporous silica film prepared according to Example 2.
Figure 4:
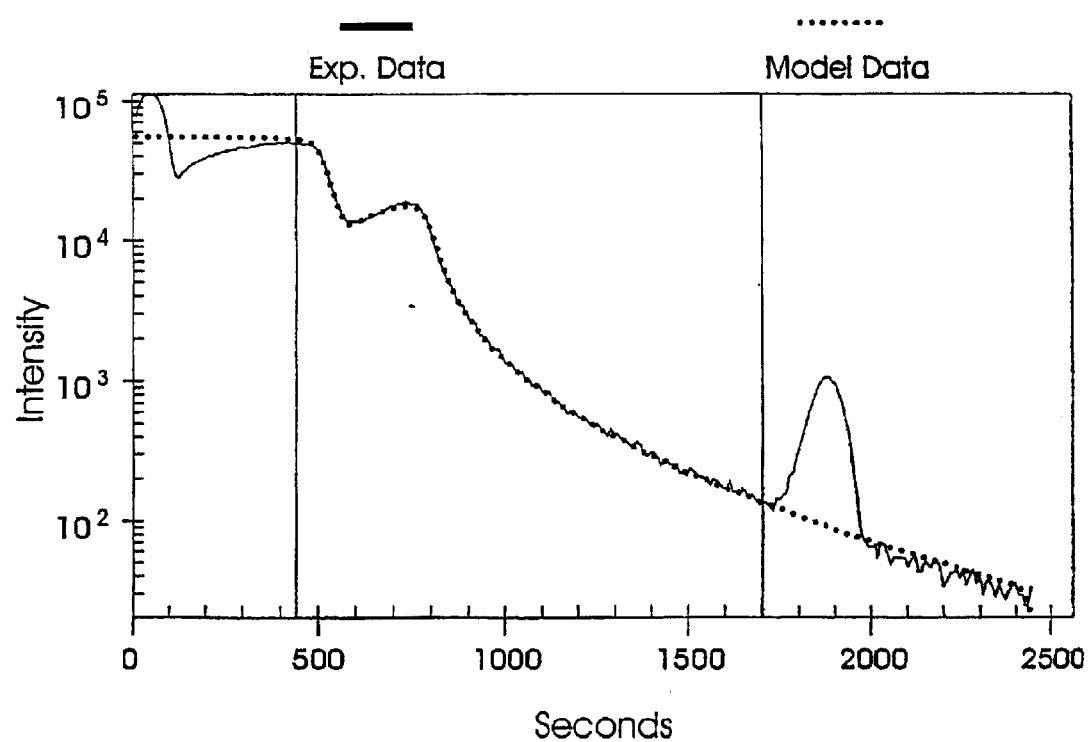
FIG. 4 is a graph showing GIXR data for a mesoporous silica film prepared according to Example 14.

High-resolution GIXR data was obtained on a Bede D1 diffraction system with a high-resolution five-axis sample stage, a Si (220) incident beam monochromator, a scintillation detector and CuKα radiation. GIXR data was collected in θ-2θ mode from 25 arc seconds to 2500 arc seconds. FIGS. 3 and 4 show representative GIXR data for films prepared according to Examples 2 and 14, respectively.

FIG. 3 plots intensity verses angle in arc seconds. This diffraction pattern is consistent with a film that is about 5000 Å thick and has approximately 47% of the density of bulk silica. This is consistent with the ellipsometry data shown in Example 2. The plot shows only reflectivity of the x-ray beam. There is no indication of Bragg diffraction in this angular range. This result indicates that although the pores present in the film are of uniform size (as show in FIG. 2, Pore size distribution from SAW data), the degree of order is not on a long enough length scale to diffract the incident x-rays.

FIG. 4 shows the GIXR data for a film prepared according to Example 14. This film is very different than the film produced in Example 2. In this case, the sample shows no fringes, but also no appreciable density gradients (i.e., the film is isotropic). There is a Bragg diffraction peak at about 1880 arc seconds (1.04° 2θ). This relates to about a 85 Å pore center to pore center distance. Although the film does show Bragg diffraction, it is outside the range observed by Brinker et. al. in U.S. Pat. No. 5,858,457.

EXAMPLE 28

Unfunctionalized Films Using Concentrated HOAc

A spinning solution was made using 20 ml of stock solution prepared according to Example 13, 20 ml of absolute ethanol, 0.5 ml TEOS (in place of any functionalized triethoxysilane), 0.8 ml deionized water, and 2.0 ml of concentrated acetic acid. To this clear and colorless solution was added 3.00 g of L121 surfactant, accounting for 8 weight % of the spinning solution. The solution was filtered through a 0.2 micrometer syringe filter, and split into two equal lots. One lot was placed in a water bath at 70° C. for 3 hours. The heating was done to see if it could be used to reduce the induction period seen with acetic acid containing solutions. The other lot was allowed to stand at room temperature.

Both solutions were spun onto single crystalline Si wafers in accordance with the procedure described in Example 20. The films were treated as those of Example 20. Characterization data are shown in Table 9, along with comparative data from Example 29.

EXAMPLE 29

Unfunctionalized Films Using 0.07M HCl

This is a comparative example to Example 28, using a stock solution like that in Example 1, and replacing the concentrated HOAc in Example 28 with 0.07M HCl. This solution was difficult to filter through a 0.2 micrometer syringe filter, so a 1.0 micrometer filter was used. The solution was split into two lots, and treated as in Example 28. The characterization data are shown in Table 9.

TABLE 9

| Number | Days old | Rl | Percent Porosity | Thickness (nm) |
| --- | --- | --- | --- | --- |
| HOAc heated | 0 | 1.2112 | 52.6 | 140 |
| HOAc room temp. | 0 | 1.2698 | 40.2 | 33.3 |
| HCl heated | 0 | 1.1995 | 55.1 | 770 |
| HCl room temp. | 0 | — | — | — |
| HOAc heated | 1 | 1.1817 | 58.9 | 193 |
| HOAc room temp. | 1 | 1.2102 | 52.8 | 98.0 |
| HCl heated | 1 | 1.1924 | 56.6 | 726 |
| HCl room temp. | 1 | 1.1692 | 61.6 | 792 |
| HOAc heated | 7 | 1.1566 | 64.3 | 489 |
| HOAc room temp. | 7 | 1.1589 | 63.8 | 431 |
| HCl heated | 7 | 1.1919 | 56.7 | 717 |
| HCl room temp. | 7 | 1.1844 | 58.3 | 729 |

This study shows that the heating is somewhat effective in speeding up the aging process. The initial films for the acetic acid (both heated and room temperature) are very thin. Variation of the spinning conditions would be necessary to get films of useable thickness. After seven days, it appears that the porosity and thickness for both of the HOAc films are comparable and would still yield useful low dielectric constant films, but the HCl films appear to be getting more dense. This demonstrates the potential to use heating of the solutions with weaker acids to reduce the length of the induction period required to yield useful films.

EXAMPLE 30

Stock Solution Prepared Using 0.10M Oxalic Acid

A stock solution was prepared following Example 1, except using 0.10 M oxalic acid in place of HCl in the process. The same amounts of the other reagents were used.

EXAMPLE 31

Oxalic Acid Spinning Solution

Into a tared polypropylene bottle were added in the following order: 10 ml stock solution prepared in Example 30, 10 ml ethanol, 0.22 ml MTES, 0.4 ml deionized water, 1.0 ml 0.10M oxalic acid. To that solution 1.51 g L 121 surfactant was added. That weight was 8 weight % of the solution weight. The solution was sonicated for 20 minutes, and the resulting clear, colorless solution was filtered through a 0.2 micron syringe filter.

This solution was spun onto single crystalline Si wafers by depositing 1.2 ml of the spinning solution onto a wafer while spinning at 500 rpm for 7 seconds. The speed was then ramped up to 1200 rpm for 40 seconds. Calcination of the films was carried out as described in Example 2. The resulting films were characterized by spectroscopic ellipsometry. Results are shown in Table 10.

TABLE 10

| Age of Oxalic Acid Sol (days) | Rl | Percent Porosity | Thickness (nm) |
| --- | --- | --- | --- |
| 2 | 1.3894 | 16.6 | 430 |
| 3 | 1.1680 | 62.5 | 800 |
| 4 | 1.1731 | 61.4 | 811 |
| 7 | 1.1950 | 56.8 | 826 |
| 8 | 1.2026 | 55.2 | 710 |
| 14 | 1.2040 | 54.9 | 777 |

These results are comparable to those results for concentrated HOAc shown in Example 28 and Table 9, and demonstrate that the stronger oxalic acid more readily catalyzes the sol-gel reaction than acetic acid. This is expected for other strong carboxylic acids which could include glycolic and glyoxalic acid among others.

EXAMPLE 32

Ethoxylated Acetylenic Diol Surfactants

The preparation of the spinning solution requires a stock solution, containing mainly the silica, ethanol, and water, an acid, ethanol, water, and a surfactant. The stock prepared by mixing 28.3 g TEOS, 24.0 g ethanol, 2.53 g of water, and 0.11 g of 0.07 M HCl, heating the solution to 60° C. for 90 minutes, and allowing the solution to cool back to room temperature before use.

The spinning solution requires 8.8 g of the stock solution prepared above, 12.5 g ethanol, 0.4 g water, 1 g 0.07 M HCl, and 2 g of surfactant, Surfynol 465 and Surfynol 485. The solution is then sonicated for 20 minutes and filtered through a 0.2 micron Acrodisc. The solution are then dispensed onto wafers and spun to dryness. After the wafers are prepared the surfactant is removed using thermal decomposition at 425° C. in $N_2$. The results from these solution for both the Surfynol 465 and Surfynol 485 are shown in Table 11.

TABLE 11

| Day | thickness (nm) | porosity (%) | RI | Spinning Parameters |
| --- | --- | --- | --- | --- |
| Surfynol 465 | | | | |
| 0 | 516 | 56.6 | 1.1924 | 1200 rpm, closed |
| 1 | 552 | 57.8 | 1.1868 | 1200 rpm, closed |
| 6 | 479 | 55.7 | 1.1966 | 1800 rpm, open |
| 11 | 389 | 55.0 | 1.1998 | 1800 rpm, open |
| 24 | 473 | 58.7 | 1.1826 | 1800 rpm, open |
| Surfynol 485 | | | | |
| 0 | 516 | 56.6 | 1.1924 | 1200 rpm, closed |
| 1 | 598 | 61.0 | 1.1719 | 1200 rpm, closed |

TABLE 11-continued

| Day | thickness (nm) | porosity (%) | RI | Spinning Parameters |
|---|---|---|---|---|
| 6 | 502 | 55.1 | 1.1994 | 1800 rpm, open |
| 11 | 425 | 54.3 | 1.2031 | 1800 rpm, open |
| 24 | 512 | 56.7 | 1.1919 | 1800 rpm, open |

EXAMPLE 33

Lower Concentrations of Ethoxylated Acetylenic Diols

This example shows the effects of lowering the surfactant concentration on the film properties. The same procedure as Example 32 was used except that the amount of Surfynol 465 was decreased from the original 8 wt % (2.0 g) in the formulation to 4% (1.0 g) and 2% (0.5 g). All of wafers were spun in an open bowl configuration at 1800 r.pm. for 20 seconds and then calcined at 425° C. in $N_2$ to remove the surfactant. Results are in Table 12, below.

TABLE 12

| Weight % Surfynol 465 | thickness (nm) | porosity (%) | RI |
|---|---|---|---|
| 8 | 434 | 57.7 | 1.1872 |
| 4 | 358 | 35.8 | 1.2906 |
| 2 | 291 | 14.8 | 1.3907 |

EXAMPLE 34

Ethoxylated Acetylenic Diols and Oxalic Acid

This example shows the use of oxalic acid in place of the HCl. The preparation replaces the 0.07 M HCl in the spinning solution and stock solution with 0.1 M oxalic acid using the same weighed amounts of each reagent. The solutions are mixed, sonicated, and filtered through a 0.2 micron Acrodisc before being spun onto a wafer. The wafers were spun in an open bowl configuration at 1800 r.p.m. for 20 seconds to remove excess solution and solvent and then calcined at 425° C. in N2 to remove the surfactant from the film. Results are reported in Table 13, below.

TABLE 13

| Surfactant | thickness (nm) | porosity (%) | RI |
|---|---|---|---|
| Surfynol 465 | 403 | 51.4 | 1.2167 |
| Surfynol 485 | 405 | 57.7 | 1.1872 |

EXAMPLE 35

Purity Analysis of Surfactants

This example shows the purity of the starting surfactant before any additional purification is attempted. The Surfynol is clearly much lower in those metals that have been screened for than many other commercially available surfactants as shown below. By having these metals low in the initial material, the clean-up to the electronic grade should be much easier, i.e. <20 ppb. Analysis results are reported in Table 14. Triton X-114 is available from Union Carbide Corporation of Charleston, W. Va.

TABLE 14

| Surfactant | ppm Na | ppm K |
|---|---|---|
| Triton X-114 | 427.6 | 1.0 |
| BASF L121 | 2.6 | 483.1 |
| BASF L101 | 0.24 | 1.9 |
| Surfynol 465 | 0.18 | 0.81 |
| Surfynol 485 | 0.19 | 0.85 |

EXAMPLE 36

Pore Size Determination

This example shows the pore sizes of the resulting films using the Surfynol surfactants from the preparations in the first example after calcination. The following Table 15 shows that the Surfynols give much smaller pore sizes, as measured using the SAW technique, than the block co-polymers, yet still have the porosity and refractive index similar to the mesoporous films.

TABLE 15

| Surfactant | Median Pore Diameter (Å) | Average Pore Diameter (Å) |
|---|---|---|
| BASF L121 | 50 | 43 |
| BASF L101 | 41 | 37 |
| Surfynol 465 | 29 | 29 |
| Surfynol 485 | 29 | 29 |

EXAMPLE 37

Effect of Methyltriethoxysilane (MTES) and Purified Triton X-114 Surfactant Amounts in Formulation on Dielectric Constant (k), k Stability and Mechanical Properties A series of solutions were prepared where the amounts of methyltriethoxysilane (MTES) and purified Triton X-114 surfactant were varied to determine an optimum combination of low dielectric constant (k), k stability (using an 85° C./85% relative humidity (85/85) test after 2 hours), and high modulus.

The solutions were prepared using as a basis the following formulation. This formulation is described as a 50% MTES/ 5% surfactant formulation as 50 weight % of the silica source is MTES and the surfactant is added at 5 weight % of the total formulation weight.

TABLE 16

| Chemical | basis [grams] |
|---|---|
| TEOS | 22.500 |
| MTES | 22.500 |
| Ethanol | 135.525 |
| DI Water | 8.255 |
| TMAH (2.4 weight %) | 7.370 |
| 0.1N $HNO_3$ | 40.000 |
| Surfactant | 11.800 |
| Total | 242.950 |

TABLE 17

Results for films prepared varying MTES and surfactant level.

| % MTES | % Surfactant | Thickness (Å) | Refractive Index | K initial | k after 2 hours 85/85 | % k increase | Nanoindentation results Modulus (GPa) | Hardness (GPa) |
|---|---|---|---|---|---|---|---|---|
| 40 | 4 | 4343 | 1.205 | 2.48 | 2.63 | 6.0% | 3.82 | 0.462 |
| 40 | 5 | 4574 | 1.200 | 2.25 | 2.36 | 4.9% | 2.74 | 0.343 |
| 40 | 6 | 5169 | 1.180 | 2.11 | 2.21 | 4.7% | 1.98 | 0.266 |
| 50 | 4 | 4412 | 1.217 | 2.29 | 2.35 | 2.6% | 3.17 | 0.416 |
| 50 | 5 | 4749 | 1.206 | 2.15 | 2.21 | 2.8% | 2.41 | 0.330 |
| 50 | 6 | 5254 | 1.180 | 2.05 | 2.09 | 2.0% | 1.94 | 0.302 |
| 60 | 4 | 4538 | 1.217 | 2.24 | 2.29 | 2.2% | 2.70 | 0.492 |
| 60 | 5 | 4838 | 1.207 | 2.11 | 2.15 | 1.9% | 2.10 | 0.301 |
| 60 | 6 | 5334 | 1.184 | 2.01 | 2.05 | 2.0% | 1.69 | 0.268 |

All films were spun onto 8" wafers and processed using the same anneal process (air cure at 90, 180 and 400° C. for 1.5, 1.5 and 3 minutes, respectively). The films were further thermally processed at 425° C. for 6 minutes in a reduced pressure of $N_2$.

This study clearly shows there is a tradeoff between the mechanical and dielectric stability of the films. This can be balanced by working at low surfactant and a modest amount of MTES. In this study, the optimal mixture is the 50% MTES/4% surfactant formulation. This gave the lowest k, best k stability, with the highest modulus. The advantage is that no subsequent treatments are required to achieve dielectric stability. This simplifies the process need to prepare the film for dielectric applications.

While the invention has been described in detail and with reference to specific examples thereof, it will be apparent to one skilled in the art that various changes and modifications can be made therein without departing from the spirit and scope thereof.

What is claimed is:

1. A ceramic film produced by a method comprising:
    preparing a film-forming fluid comprising an functionalized alkoxysilane ceramic precursor, a catalyst, a surfactant and solvent(s);
    depositing aid film-forming fluid on said substrate; and
    removing said solvent(s) from said film-forming fluid on said substrate to produce said ceramic film on said substrate,
    wherein said ceramic film has a dielectric constant below 2.3, and a metal content of less than 500 ppm.

2. The ceramic film of claim 1, wherein said dielectric constant is from 2.2 to 1.3.

3. The ceramic film of claim 1, having a halide content less than 500 ppb.

4. The ceramic film of claim 1, wherein said metal content is less than 1 ppm.

5. The ceramic film of claim 1, wherein said metal content is less than 100 ppb.

6. The ceramic film of claim 1, having a porosity of about 50% to about 80%.

7. The ceramic film of claim 1, having a porosity of about 55% to about 75%.

8. The ceramic film of claim 1, wherein said film includes pores sufficiently order in a plane of the substrate that an X-ray diffraction pattern of said film shows a Bragg diffraction at a d spacing greater than about 44 Å.

9. The ceramic film of claim 1, wherein said film does not include pores sufficiently order in a plane of the substrate such that an X-ray diffraction pattern of said film shows a Bragg diffraction.

10. A ceramic film of claim 1 wherein said ceramic precursor is an alkylalkoxysilane of a formula selected from the group consisting of RSi(OR')$_3$; R$_2$Si(OR')$_2$; R$_3$SiOR'; RR'Si(OR')$_2$; and RR'R"SiOR'"; where R, R', R" and R'" are individually methyl, ethyl, isopropyl, or butyl, which provides improved dielectric constant stability, maintains low dielectric constant value and maintains high modulus.

11. A ceramic film of claim 1 wherein said ceramic precursor is an alkylalkoxysilane of a formula selected from the group consisting of RSi(OR')$_3$; R$_2$Si(OR')$_2$; R$_3$SiOR'; RR'Si(OR")$_2$; and RR'R"SiOR'"; where R, R', R" and R'" are individually methyl, ethyl, isopropyl, or butyl.

* * * * *